United States Patent [19]

Le Roux et al.

[11] Patent Number: 5,028,811
[45] Date of Patent: Jul. 2, 1991

[54] CIRCUIT FOR CONTROLLING A POWER MOS TRANSISTOR ON AN INDUCTIVE LOAD

[75] Inventors: Gérard Le Roux, La Tronche; Michel Barou, Voreppe, both of France

[73] Assignee: SGS-Thomson Microelectronics S.A., Gentilly, France

[21] Appl. No.: 493,537

[22] Filed: Mar. 14, 1990

[30] Foreign Application Priority Data

Mar. 15, 1989 [FR] France ............... 89 03636

[51] Int. Cl.⁵ .................... H03K 3/01; H03K 17/60; H03K 5/22; H03K 17/687
[52] U.S. Cl. .................... 307/270; 307/254; 307/494; 307/571
[58] Field of Search ........... 307/571, 270, 253, 254, 307/494, 495

[56] References Cited

U.S. PATENT DOCUMENTS

| | | | |
|---|---|---|---|
| 4,599,555 | 7/1986 | Damiano et al. | 307/571 |
| 4,603,269 | 7/1986 | Hochstein | 307/571 |
| 4,628,341 | 12/1986 | Thomas | 357/42 |
| 4,642,674 | 2/1987 | Schoofs | 357/23.8 |
| 4,728,826 | 3/1988 | Einzinger et al. | 307/571 |
| 4,931,676 | 6/1990 | Baiochi et al. | 307/571 |

FOREIGN PATENT DOCUMENTS

0132861 2/1985 France .
0239861 10/1987 France .

Primary Examiner—Stanley D. Miller
Assistant Examiner—Trong Phan
Attorney, Agent, or Firm—Lowe, Price, LeBlanc and Becker

[57] ABSTRACT

In a circuit comprising a power MOS transistor (MP) connected to an inductive load (L), the gate (GP) of the power MOS transistor is connected, on the one hand, to a voltage booster circuit (3) and, on the other hand, to the drain (DL) of a logic MOS transistor (ML). A control circuit (56) fed by the supply source has an output (63) connected to the gate (GL) of the logic MOS transistor. Means are provided for limiting the source voltage of the logic MOS transistor to a voltage lower than the supply voltage (VCC) minus a predetermined threshold voltage when the power MOS transistor is conductive. The control circuit is then capable of controlling the switching of the logic MOS transistor with the supply voltage available at the supply source.

4 Claims, 4 Drawing Sheets

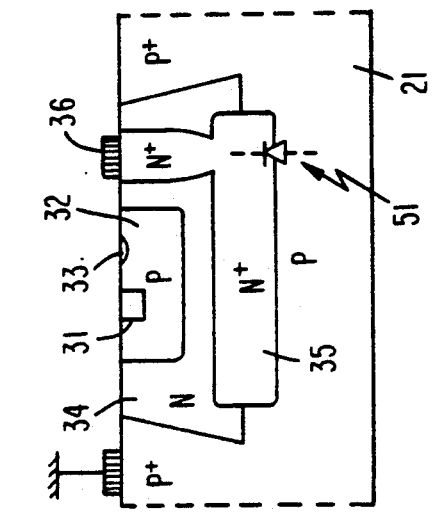
FIG. 2A-I
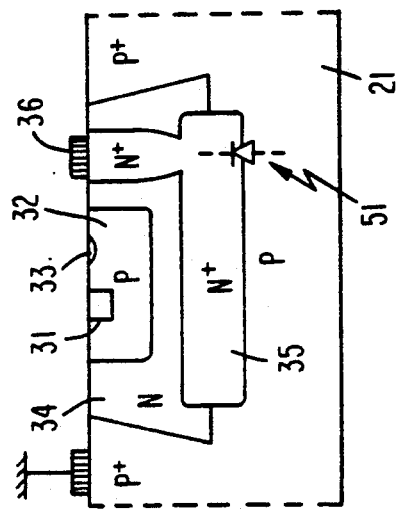
FIG. 2A-II
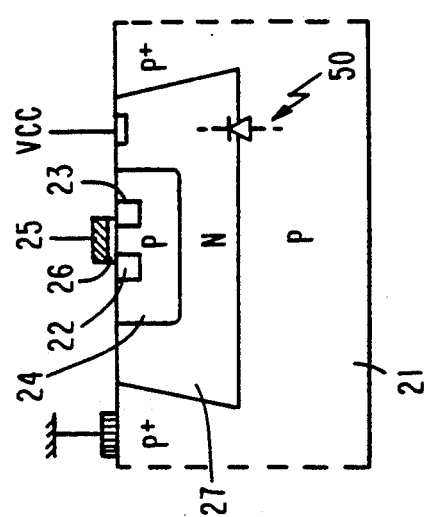
FIG. 2A-III
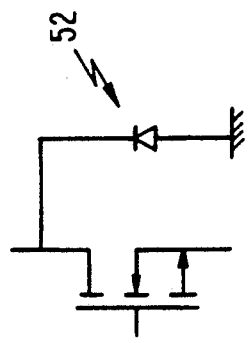
FIG. 2B-I
PRIOR ART
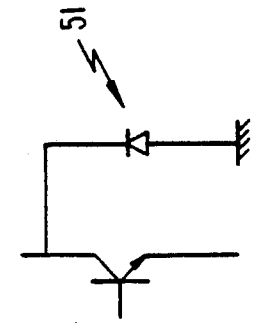
FIG. 2B-II
PRIOR ART
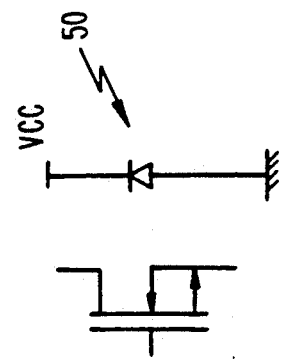
FIG. 2B-III
PRIOR ART

CIRCUIT FOR CONTROLLING A POWER MOS TRANSISTOR ON AN INDUCTIVE LOAD

BACKGROUND OF THE INVENTION

The present invention relates to the field of power MOS transistors and more particularly to power MOS transistors, formed according to the so-called N-channel DMOS (Diffused MOS) technology, which require, when their drain is connected to a supply source and their source is connected to a load, a gate voltage higher than the supply voltage. The case of power MOS transistors connected to inductive loads is more particularly considered.

FIG. 1 illustrates a first way of forming a circuit wherein an inductive load L is connected to the source SP of a power MOS transistor MP, the drain DP of which is connected to the first terminal 1 of the supply source, the free terminal of the load being connected to the second terminal 2 of this supply source. Terminal 1 of the supply source supplies a positive voltage VCC and terminal 2 is grounded.

A voltage booster circuit 3, internal to the circuit and supplying a voltage VH higher than the supply voltage VCC, is connected to the gate GP of the MOS transistor MP through a current source 4. The gate GP is further connected to the drain DP-1 of a DMOS transistor MP-1, the source SP-1 of which is connected to terminal 2 of the supply source and the gate GP-1 is connected to a control circuit 5.

Schematically, the control circuit 5 supplies at the gate GP-1 low level voltage signals and high level voltage signals for controlling transistor MP-1. In case of low level signals, MOS transistor MP-1 is blocked and MOS transistor MP is conductive.

When the signals applied on gate GP-1 switch from low level to high level, transistor MP-1 becomes conductive. This transistor absorbs the current from the current source 4. which causes MOS transistor MP to be blocked.

When the current of an inductive load is interruped, there occurs at tis terminals an overvoltage according to relation $V = -Ldi/dt$. The voltage on source SP of transistor MP tends to drop below the ground.

When transistor MP is switched off, it is desirable that the inductive load be discharged as fast as possible, that is, that quantity di/dt be as high as possible. Therefore, it is desired that the voltage on the transistor source substantially drop. On the other hand, if the source voltage drops, the gate voltage also drops while the difference between the gate and source voltages is equal to the threshold voltages $V_{TP}$ of transistor MP. But, a too low gate voltage would cause transistor to breakdown. One has thus provided for a clamping device 6 constituted by a set of n Zener diodes Z1, Z2, ..., Zn in series wherein diode Z1 has its cathode 7 connected to the terminal 1 of the supply source and wherein diode Zn has its anode 8 connected to the gate of transistor MP. The voltage drop on the source of transistor MP is limited to a clamping voltage equal to $VCC-(nV_Z+V_{TP})$, where $V_Z$ is the Zener voltage of each of the Zener diodes Z1, Z2, ..., Zn. The supply voltage VCC is for example 35 volts. The net voltage drop corresponding to the sum of n Zener voltages of diodes Z1, Z2, ..., Zn is for example 50 volts. The threshold voltage $V_{TP}$ between the gate and source of MOS transistor MP is about 3 volts. Thus, the source voltage of transistor MP is liable to decrease down to a clamping voltage of about −20 volts.

The circuit of FIG. 1 is commonly implementable without difficulties. However, for the type of technology which is shown in FIGS. 2A and 2B, the DMOS transistor MP-1 prevents the voltage from dropping down to the clamping voltage.

FIG. 2A is a section view of a logic MOS transistor (portion I), an NPN bipolar transistor (portion II) and a portion of a power MOS transistor (portion III) with a technology capable of incorporating such transistors in the same integrated circuit chip. The components are formed on a P-type substrate 21.

In logic transistor I, two N-type diffusions 22, 23 are formed in a P-type box 24 for constituting the drain and source, respectively. The transistor gate 25 is located above a gate oxide layer 26. The P-type box 24 is in turn located in another N-type box 27 which is connected to the terminal of the supply source supplying the positive voltage VCC. The substrate is grounded.

The NPN bipolar transistor II comprises an emitter 31 constituted by an N-type diffusion in a P-type box 32 which forms the transistor base. The base contact is taken on an overdoped $P^{30}$ region 33. The P-type box 32 is located in an N-type box 34 which constitutes the collector. Box 34 is in contact with an $N^{30}$-type buried layer 35 connected to a collector contact 36.

A DMOS transistor comprises a set of cells, one of which is shown in portion III of FIG. 2A. A cell comprises two regions 39-1, 39-2 constituted by P-type diffusions. In each region 39-1, 39-2 are formed two N-type diffusions 40 which constitute the power transistor source. The two diffusions 40 are interconnected through a conductive layer 41. The lateral edges of regions 39-1, 39-2 constitute the channel regions 42. Regions 39-1, 39-2 are positioned in an N-type box 43 forming the transistor drain. Box 43 contacts an $N^+$-type buried layer 44 connected to a drain contact 45. Each cell comprises a gate 46 located above a gate oxide layer 47.

FIG. 2B represents in portions I, II and III the symbols of the transistors shown in portions I, II and III of FIG. 2A, respectively. Near each transistor symbol is shown a diode present in the structure. Those diode symbols are also shown in the structures of FIG. 2A. In portion I, a diode 50 is formed between substrate 21 and the N-type box 27. Its anode is grounded and its cathode is connected to the terminal of the supply source which supplies voltage VCC. The structure of portion II exhabits a diode 51 between substrate 21 and the $N^+$-type buried layer 35. Its anode is grounded and its cathode is connected to the collector of the bipolar transistor. In portion III, a diode 52 is located between substrate 21 and the $N^+$-type buried layer 44. Its anode is grounded and its cathode is connected to the power transistor drain.

In FIG. 1, diode 52 in the DMOS transistor MP-1 is drawn in dotted lines. This diode 52 exhibits across its terminals a voltage drop $V_D$ when it is forward biased. Thus, at the switching off of MOS transistor MP, the voltage on source SP of this transistor MP cannot drop below the value $-(V_D+V_{TP})$, that is substantially −3.7 volts. The above mentioned clamping voltage, of about −20 volts, is not reached.

If a bipolar transistor is substituted for the DMOS transistor MP-1, the same problem is encountered due to the presence of diode 51.

The only type of transistor liable to replace DMOS transistor MP-1 is the logic MOS transistor. Diode 50 in this transistor does not impair the circuit operation.

Another way of forming a circuit wherein an inductive load L is fed through a power MOS transistor MP is shown in FIG. 3. In this circuit, transistor MP has its gate GP connected to drain DL of a logic MOS transistor ML. A voltage booster device 3 and a clamping device 6 are arranged in the same way as shown in FIG. 1.

A conventional control circuit 56 is shown in detail. It is fed by the circuit supply source. This allows the voltage booster device 3 to feed the gate of transistor MP only. The control circuit comprises a differential stage 59 formed by a current source 60, a reference voltage source 61 supplying a reference voltage $V_R$ and two MOS transistors MP-2 and MP-3 of the diffused-type comprising one cell. The gate of transistor MP-2 constitutes the input 62 of the control circuit. Transistors MP-2 and MP-3 are connected to current mirrors M2, M3, respectively, each of which is in turn comprised of a pair of P-channel MOS transistors arranged as shown in the figure. Current mirror M2 is connected to drain DA of a logic MOS transistor MA and current mirror M3 is connected to drain DB of a logic MOS transistor MB, transistors MA and MB being also arranged as a current mirror M in the way shown in the figure. Drain DB of transistor MB constitutes output 63 of the control circuit 56, this output being connected to gate GL of the logic MOS transistor ML. Sourches SA and SB of transistors MA and MB, respectively, are interconnected and connected to source SL of transistor ML through an auxiliary connection 64. The source of transistor ML is in turn connected to the source SP of transistor MP.

A control circuit such as circuit 56, with an appropriate supply, operates in the following way. When the voltage on input 62 of the control circuit is higher than the reference voltage $V_R$, transistor MP-2 of the differential stage is conductive and transistor MP-3 is blocked. Since transistor MP-2 is conductive, the transistors of the current mirror M2, as well as the transistors of the current mirror M, are conductive. Conversely, since transistor MP-3 is blocked, the transistors of the current mirror M3 are blocked. The voltage at output 63 of the control circuit is set to low level to render transistor ML blocked and power MOS transistor MP conductive.

When the voltage at input 62 of the control circuit is lower than the reference voltage $V_R$, transistor MP-2 and the transistors of cirrent mirrors M2 and M are blocked. Transistor MP-3 and the transistors of currrent mirror M3 are conductive. The voltage at output 63 of the control circuit is set to high level to render transistor ML conductive and transistor MP blocked.

In the type of technology implemented, transistors MA and MB are necessarily logic MOS transistors. Indeed, if DMOS transistors or bipolar transistors were used, diodes 52 or 51, respectively, would be formed (FIGS. 2A and 2B). If the substrate happened to be isolated from the ground, spurious pulses might be transmitted to the drains or collectors of those transistors through the diodes. This would especially impair the gate voltage of the logic MOS transistor ML.

The logic MOS transistors MA and MB, as well as logic MOS transistor ML, are positioned in an N-type box (box 27 in FIG. 2A) which is in turn connected to the supply source. The voltages at their sources, gates and drains may then decrease substantially below the voltage of the substrate which is grounded. Thus, the voltage at source SP of transistor MP is liable to decrease down to clamping voltage.

However, a problem is incountered in the phase where input 62 of the control circuit is set to high level to render power MOS transistor MP conductive. Indeed, in case such a power MOS transistor is conductive, the voltage drop between the drain and source is low, for example about 0.3 volt. The voltage at the sources SA and SB of transistors MA and MB, respectively, would then be equal to the supply voltage VCC minus 0.3 volt. On the other hand, it has been noted that the logic MOS transistors MA and MB were set to conductive state to render transistor MP also conductive. But, for a logic MOS transistor to be conductive, its drain voltage has to be higher than its source voltage by at least a threshold voltage $V_L$ which is about 1.5 volts. The voltage at the drains of the logic MOS transistors MA and MB has therefore to be substantially higher than the supply voltage VCC. Thus, since it is necessary to use logic MOS transistor for transistors MA and MB in the technology used and shown in FIGS. 2A and 2B, it is impossible to feed the control circuit with the supply source. The problem encountered is that it is impossible to control transistor ML with a control circuit connected to the supply source when input 62 is at high level to render transistor MP conductive.

The method which would consist in feeding the control circuit with the voltage booster circuit cannot be considered since this booster circuit already feeds the gate of the power MOS transistor MP and cannot withstand the additional load of the control circuit.

SUMMARY OF THE INVENTION

The invention provides for a circuit with a power MOS transistor MP wherein the source of transistor MP is liable to drop down to the clamping voltage and wherein the control circuit, while being fed by the supply source, permits control of the logic MOS transistor ML when the control circuit input is at high level.

More precisely, the invention provides for a circuit comprising a power MOS transistor connected by its drain to a first terminal of the supply source and by its source to an inductive load, the free terminal of which is connected to the second terminal of the supply source. This circuit is formed according to a technology liable to incorporate in a same integrated circuit chip power MOS transistors, logic MOS transistors and bipolar transistors, the grounded substrate constituting, on the one hand, in the power MOS transitors, the anode of a diode, the cathode of which is formed by the drain and, on the other hand, in bipolar transistors, the anode of a diode, the cathode of which is formed by the collector. The gate of the power MOS transistor is connected, on the one hand, to a voltage booster circuit and, on the other hand, to the drain of a logic MOS transistor. A control circuit fed by the supply source has an output connected to the gate of the logic MOS transistor and is connected through an auxiliary connection to the source of the logic MOS transistor, the auxiliary connection being capable of withstanding a substantial voltage drop. Means for limiting the source voltage of the logic MOS transistor to a voltage lower than the supply voltage minus a determined threshold voltage when the power MOS transistor is conductive are provided for, whereby the control circuit is capable of controlling switching of the logic MOS transistor with the supply voltage available at the supply source.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1, already described, shows a first conventional way to form a circuit for feeding an inductive load through a power MOS transistor;

FIG. 2A-I is a section view of the structure of a logic MOS transistor;

FIG. 2A-II is a section view of the structure of an NPN bipolar transistor;

FIG. 2A-III is a section view of a portion of a power MOS transistor;

FIG. 2B-I shows the circuit of the transistor of FIG. 2A-I;

FIG. 2B-II shows the circuit of the transistor of FIG. 2A-II;

FIG. 2B-III shows the circuit of the transistor of FIG. 2A-III;

FIG. 3 shows a second conventional way to form a circuit for feeding an inductive load through a power MOS transistor; and FIG. 4 shows a circuit designed to feed an inductive load through a power MOS transistor according to the invention.

Generally speaking, as conventional in the field of integrated circuit representation, it will be noted that the various drawings are not drawn to scale either inside one figure or from one figure to the othere, and in particular the thicknesses of the various layers are arbitrarily drawn in order to facilitate the legibility of the drawings.

DESCRIPTION OF A PREFERRED EMBODIMENT

Figure 1:
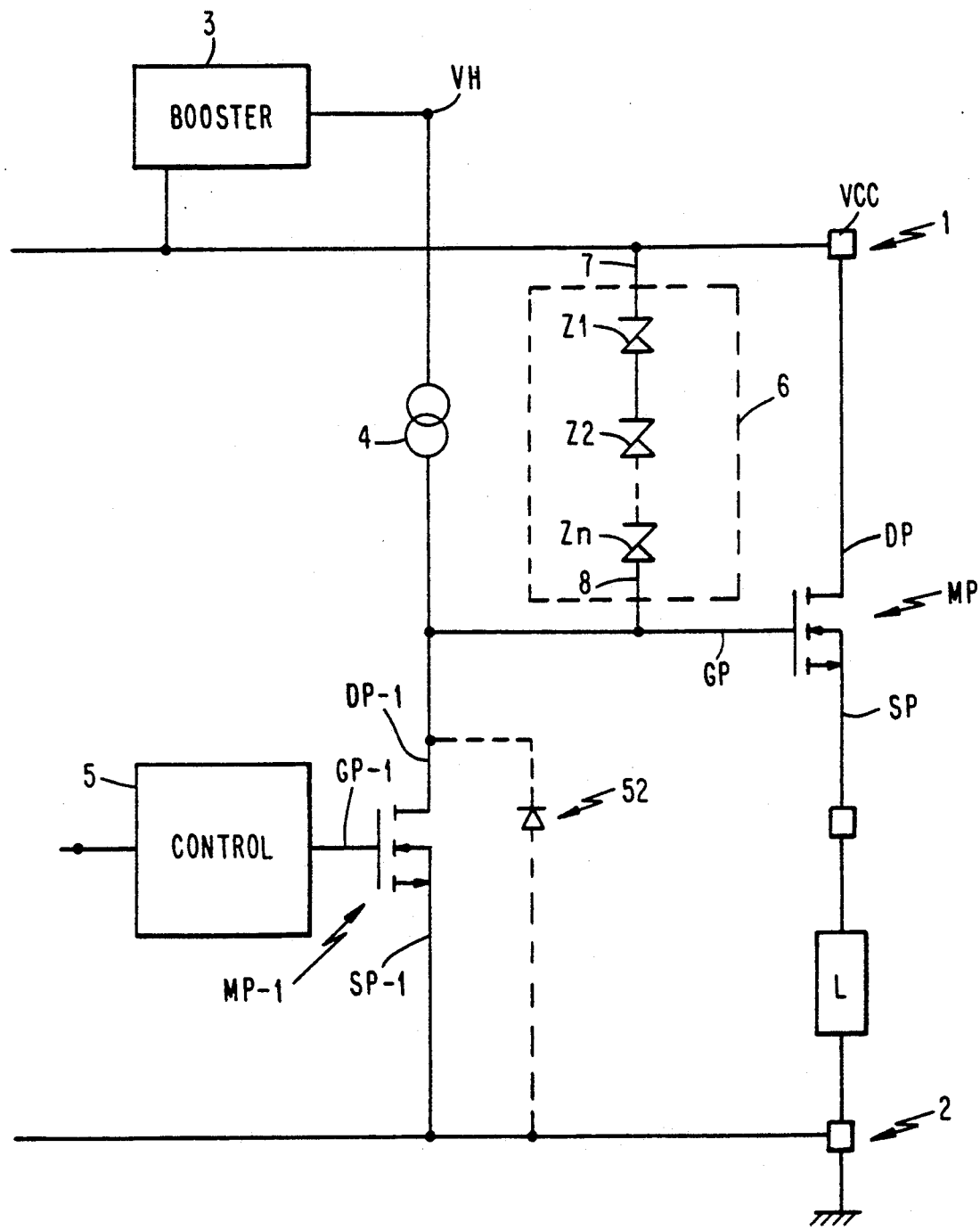
Figure 3:
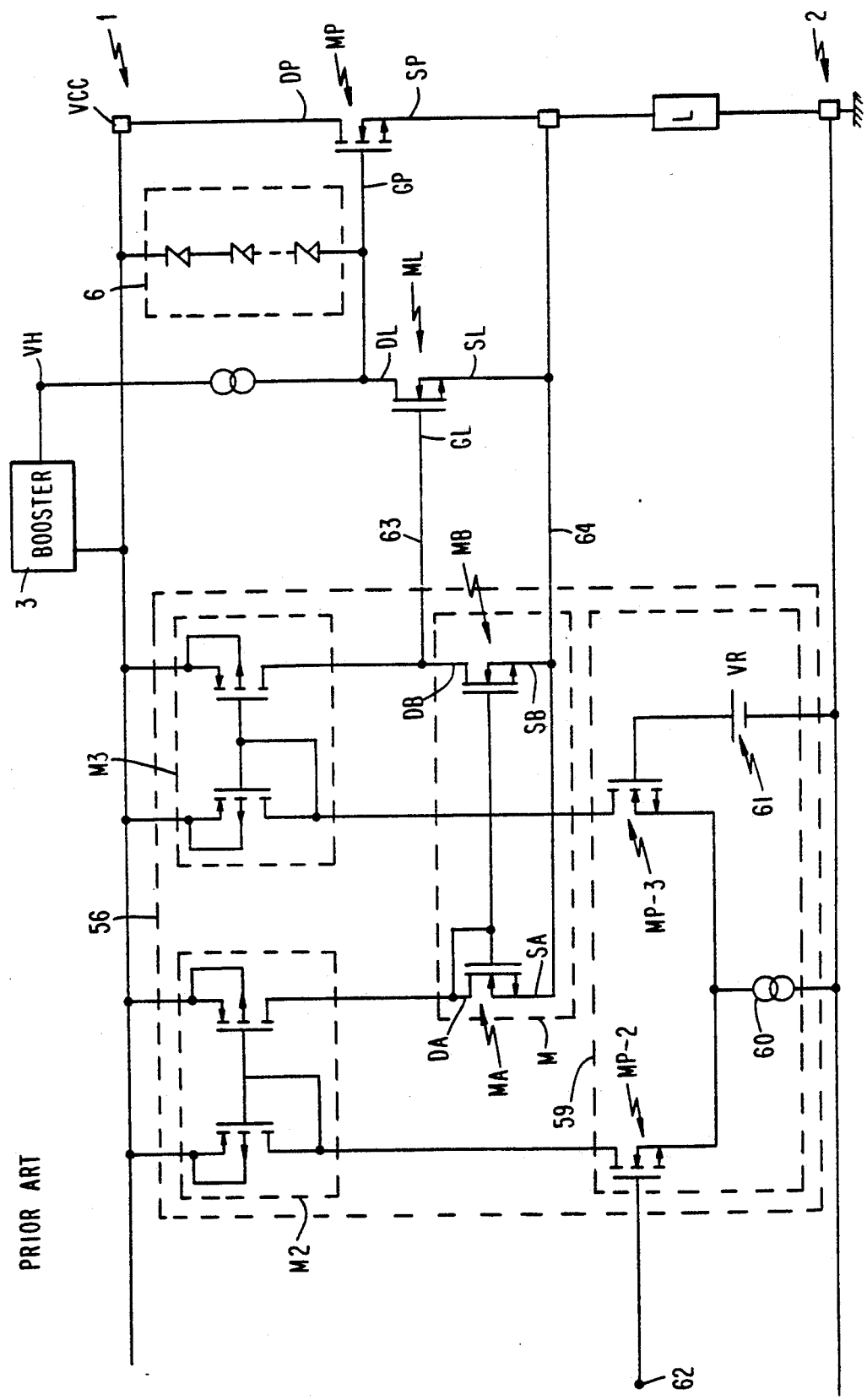
Figure 4:
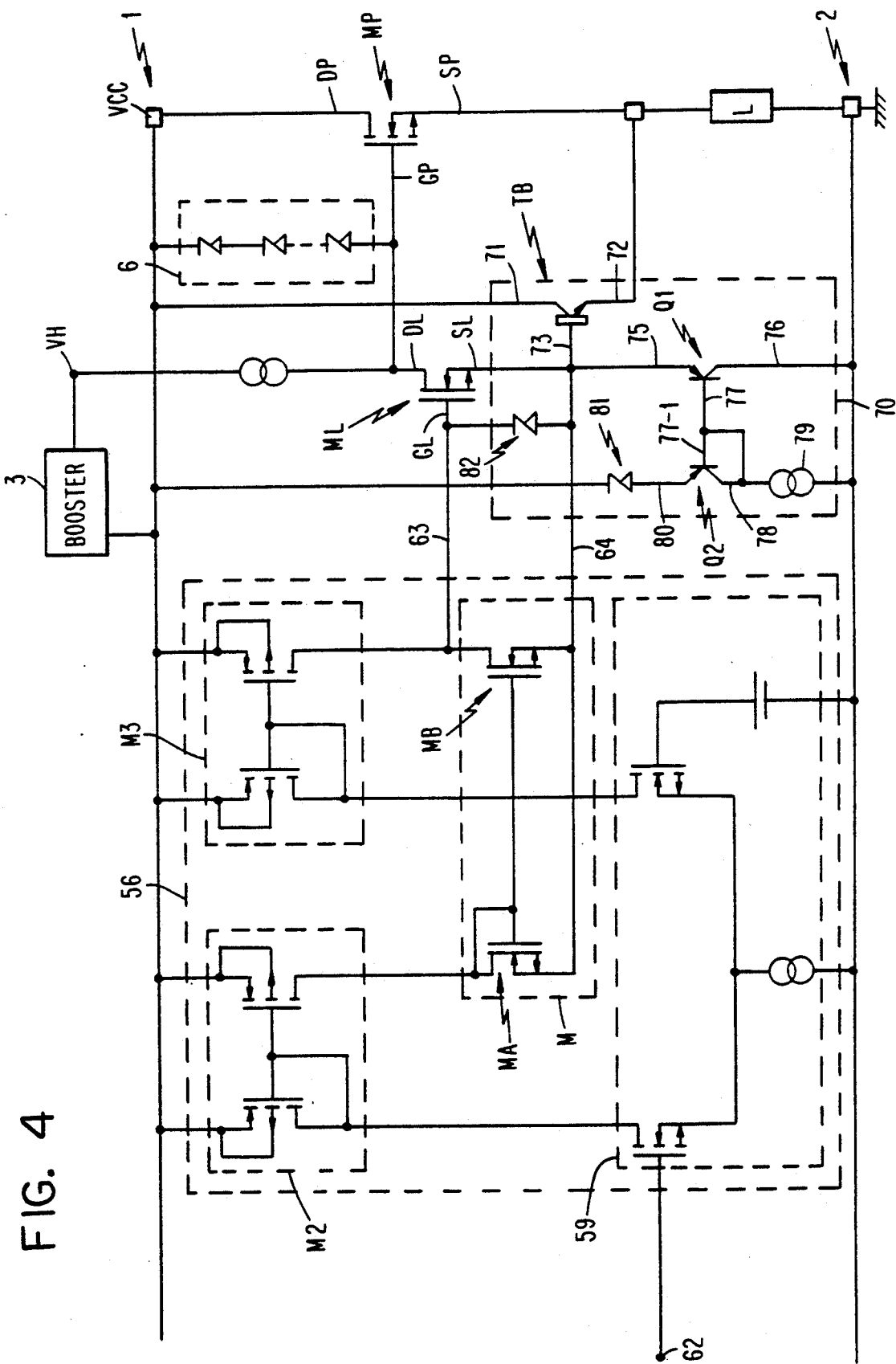

FIG. 4 shows a circuit comprising as in FIG. 3 a power MOS transistor MP, an inductive load L, a voltage booster circuit 3 and a clamping device 6. A control circuit 56, fed by the supply source of the circuit, has an input 62 and an output 63 which is connected to the gate GL of a logic MOS transistor ML, the drain DL of which is connected to the gate GP of transistor MP. The control circuit is connected to the source SL of transistor ML through an auxiliary connection 64.

As compared with FIG. 3, a voltage clamping circuit 70 has been added. It comprises an NPN bipolar transistor TB, the collector 71 of which is connected to terminal 1 of the supply source and emitter 72 is connected to the source SP of the power MOS transistor MP. Base 73 of the bipolar transistor TB is, on the one hand, connected to the source SL of the logic MOS transistor ML and, on the other hand, to the emitter 75 of a PNP bipolar transistor Q1, the collector 76 of which is grounded and the base 77 is connected to the base 77-1 of a second PNP transistor Q2 and is connected to the collector 78 of this transistor Q2. The collector 78 of transistor Q2 is grounded through a current source 79. Emitter 80 of transistor Q2 is connected to the anode of a Zener diode 81, the cathode of which is connected to the terminal 1 of the supply source. Another Zener diode 82 is connected through its anode to base 73 of bipolar transistor TB and through its cathode to gate GL of the logic MOS transistor ML.

In the phase during which input 62 of the control circuit is at high level to render transistor MP conductive, the logic MOS transistor ML being blocked, voltage $V_{SL}$ at the source SL of this transistor ML is given by: $V_{SL} = V_{CC} - V_Z - V_{BE2} + V_{BE1}$ where voltage $V_z$ is the Zener voltage of Zener diode 81 and voltages $V_{BE1}$ and $V_{BE2}$ are voltages between the bases and emitters of transistors Q1 and Q2, respectively. With identical transistors Q1 and Q2, voltages $V_{BE1}$ and $V_{BE2}$ are counterbalanced in the calculation. The voltage at the source of transistor ML, and at the sources of the logic MOS transistors MA and MB, is then equal to the supply voltage VCC minus the Zener voltage $V_Z$ of Zener diode 81. If this Zener voltage is higher than the threshold voltage $V_L$ of a logic MOS transistor of about 1.5 volts, transistors MA and MB can be set to conductive state while the control circuit is fed by the supply source. A Zener diode 81 having a Zener voltage equal for example to 5 volts can be chosen.

At the switching off of transistor MP, the voltage at its source SP tends to drop. Owing to the presence of the base-emitter diode of bipolar transistor TB, the voltage at the source SL of transistor ML follows this drop to within a diode threshold. Transistor Q1 is blocked because the emitter-base junction is reverse biased. As previously noted, the logic MOS transistors MA, MB and ML are liable to drop below the substrate voltage. The voltage at the source SP of transistor MB is therefore liable to drop down to clamping voltage.

Transistor TB is used as a diode. However, one aspect of the invention is to use a transistor and not a diode. Indeed, in the technology used, a PN diode has its P-type anode placed in an N-type box forming its cathode. The N-type box is in turn in contact with the P-type substrate. Therefore, there would be a parasitic diode between the grounded substrate and the cathode of the PN diode.

In the circuit of FIG. 4, the bipolar transistor TB has its collector connected to terminal 1 of the supply source. Thus, the parasitic diode between the substrate and the collector is not liable to impair the circuit.

Zener diode 82 permits to limit the voltage at the gate of the logic MOS transistor ML. Indeed, in the phase during which input 62 of the control circuit is at low level, the gate voltage of transistor ML would be close to the voltage VCC without this Zener diode 82. Supply voltage VCC is for example 35 volts. Applying such a high voltage at the gate of a logic MOS transistor is damaging. The Zener voltage value of Zener diode 82 is for example 5 volts.

The current arriving on the base of the bipolar transistor TB, when input 62 of the control circuit is at low level, is the sum of a current flowing from the voltage booster circuit 3 and a current from the current mirror M3 through Zener diode 82. The current from the voltage booster circuit is for example 100 $\mu$A. The current flowing through Zener diode 82 is about 10 $\mu$A. Neglecting for a first approximation the current in the Zener diode, and considering a bipolar transistor TB having a gain 100, a 10 mA-current flows through the collector of this transistor. On the other hand, the voltage between collector and emitter of transistor TB is liable to reach about 50 volts if the supply voltage and the clamping voltage are added. The power the transistor has to withstand is then about 500 mW. The size of the transistor has to be substantially large. However, it is possible to limit the gain by overdoping the region forming the base of this transistor (box 32 in FIG. 2A). A gain lower than 10 can be reached. The electrical power the transistor has to withstand is then about 50 mW only. Thus, according to a variant of the invention, a bipolar transistor TB with a low gain is provided, which permits to substantially reduce its size.

In the embodiment herein described, a voltage booster circuit is used for feeding the gate of the power MOS transistor MP only and a logic-type control circuit is used (the trnsistors of the whole circuit may have two states: either a conductive or a blocked state), this control circuit operating between the level of the supply voltage VCC and a voltage level lower than the ground. It is clear that it is possible to replace the logic control circuit by an analog control circuit also operating between the voltage VCC and the voltage level lower than the ground, to regulate for example the source voltage of the power MOS transistor.

We claim:

1. A circuit comprising:

a power MOS transistor (MP) connected by its drain (DP) to a first terminal (1) of a supply source and by its source (SP) to an inductive load (L), the free terminal of which is connected to the second terminal (2) of the supply source, this circuit being formed to incorporate in the same integrated circuit chip power MOS transistors, logic MOS transistors and bipolar transistors, the grounded substrate constituting, on the one hand, in the power MOS transistors, the anode of a diode, the cathode of which is formed by the drain and, on the other hand, in the bipolar transistors, the anode of a diode, the cathode of which is formed by the collector, the gate (GP) of the power MOS transistor being connected, on the one hand, to a voltage booster circuit (3) and, on the other hand, to the drain (DL) of a logic MOS transistor (ML), a control circuit (56) fed by the supply source having an output (63) connected to the gate (GL) of the logic MOS transistor and being connected through an auxiliary connection (64) to the source (SL) of the logic MOS transistor, the auxiliary connection being liable to withstand a substantial voltage drop, and means for limiting the source voltage of the logic MOS transistor to a voltage lower than the supply voltage (VCC) minus a determined threshold voltage when the power MOS transistor is conductive, whereby the control circuit is capable of controlling the switching of the logic MOS transistor with the voltage available from the supply source.

2. A circuit according to claim 1, wherein said means for limiting the source voltage of the logic MOS transistor is comprised of a clamping voltage circuit (70) comprising:

an NPN bipolar transistor (TB), the collector (71) of which is connected to a first terminal (1) of the supply source, the emitter (72) of which is connected to the source (SP) of the power MOS transistor (MP) and the base (73) of which is connected to the source (SL) of the logic MOS transistor (ML), a first PNP bipolar transistor (Q1), the emitter (75) of which is connected to the source of the logic MOS transistor and the collector (76) is connected to the second terminal (2) of the supply source, a second PNP bipolar transistor (Q2), the base (77-1) of which is connected to the base (77) of the first PNP bipolar transistor, the collector (78) of which is, on the one hand, directly connected to the base of the first PNP bipolar transistor and, on the other hand, connected to the second terminal of the supply source through a current source (79), the emitter (80) of the second PNP bipolar transistor being connected to the first terminal of the supply source through a first Zener diode (81), a second Zener diode (82) being connected between the base of the NPN bipolar transistor (TB) and the gate of the logic MOS transistor (ML).

3. A circuit according to claim 1, wherein said threshold voltage is the threshold voltage ($V_L$) between the drain and source of a logic MOS transistor below which the logic MOS transistor is blocked.

4. A circuit according to claim 1, wherein the NPN bipolar transistor (TB) has a gain lower than 10.

* * * * *